April 18, 1967 H. J. SCHÜTZE ETAL 3,314,128
METHOD OF MAKING A CIRCUIT ELEMENT
Filed Sept. 21, 1962 2 Sheets-Sheet 1
Fig. I.
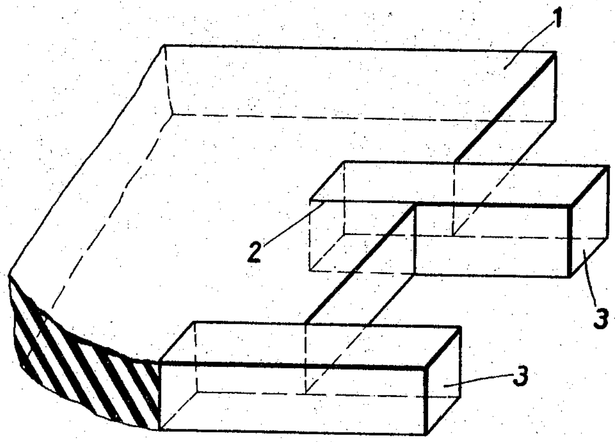
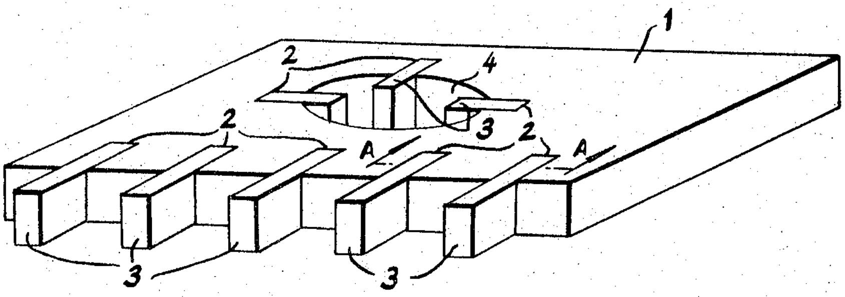
Fig. 2.
INVENTORS
Hans Jürgen Schütze
Heinz Wilhelm Ehlbeck &
Manfred Dressler
BY Spencer & Kaye
ATTORNEYS

INVENTORS

Hans Jürgen Schütze,
Heinz Wilhelm Ehlbeck,
Manfred Dressler

United States Patent Office 3,314,128

Patented Apr. 18, 1967

3,314,128

METHOD OF MAKING A CIRCUIT ELEMENT

Hans Jürgen Schütze and Heinz Wilhelm Ehlbeck, Ulm (Danube), and Manfred Dressler, Neu-Ulm (Danube), Germany, assignors to Telefunken Patentverwertungs-G.m.b.H., Ulm (Danube), Germany Filed Sept. 21, 1962, Ser. No. 225,203
Claims priority, application Germany, Sept. 21, 1961, T 20,804
3 Claims. (Cl. 29—155.5)

The present invention relates generally to the microcircuit and miniature circuit arts, and, more particularly, to an insulating body having metallic pins embedded therein to preferably serve as a carrier for microminiature circuit elements, and having along its narrow edge at least one rectangular slot.

In the micromodule technique, it has been known in the past to provide passive electrical elements by evaporating metal films or dielectric films onto carrier plates in a high vacuum or in a gaseous atmosphere by means of a cathode sputtering operation. However, there has been difficulty in mounting active elements on an insulating body and connecting the microminiature circuit with leads so as to render it possible to connect the circuit with external elements. Such lead wires cannot be connected with the circuit by means of a soldering connection from a contact point outside of the insulating body since the layers which are evaporated onto the insulating body to form the passive elements are usually a single layer in thickness which is of the magnitude of 1 micron.

In the past an attempt has been made to metallize these layers or provide additional metal at the contact point so that solder connections could be provided on the thickened or reinforced layers, but this method possesses considerable difficulties and also essential disadvantages since the evaporated layer exhibits substrate metallization in its boundary region or boundary zone.

With these defects of the prior art in mind, it is a main object of this invention to provide an arrangement for the connection of elements of a microminiature circuit with contact leads for connecting the circuit with external elements which arrangement is advantageous over those of the prior art.

Another object of this invention is to provide a relatively simple means for connecting a microminiature circuit with external elements.

These objects and others ancillary thereto are accomplished according to preferred embodiments of the invention wherein an insulating body is provided with at least one, and it may have several, slots which are preferably rectangular and are disposed along the narrow end face or edge of the body. Metal pins are inserted into the slots and preferably have a rectangular cross section. The mounting of the pins in the slots is performed in such a manner that there are no ridges, but a smooth transition is provided from at least one of the surfaces of the metal pin or pins to the surface of the insulating body.

Additional objects and advantages of the present invention will become apparent upon consideration of the following description when taken in conjunction with the accompanying drawings in which:

FIGURE 1 is a schematic perspective illustrating the instant invention.

FIGURE 2 shows an embodiment of the carrier plate according to the invention.

Figure 3A:
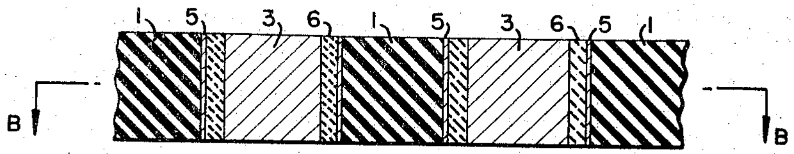

FIGURE 3*a* is a cross-sectional view taken along the plane defined by the line A—A of FIGURE 2.

Figure 3B:
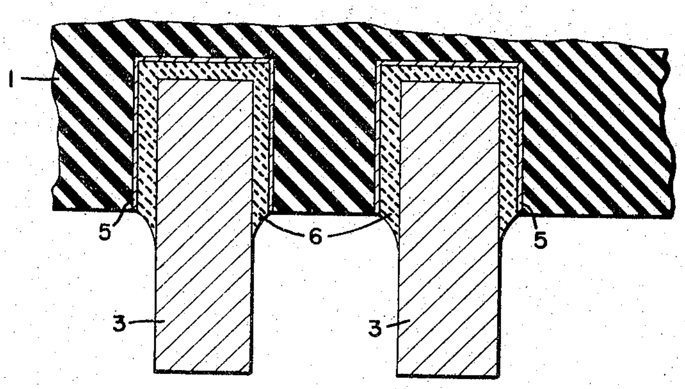

FIGURE 3*b* is a cross-sectional view taken along the plane defined by the line B—B of FIGURE 3*a*.

Figure 4:
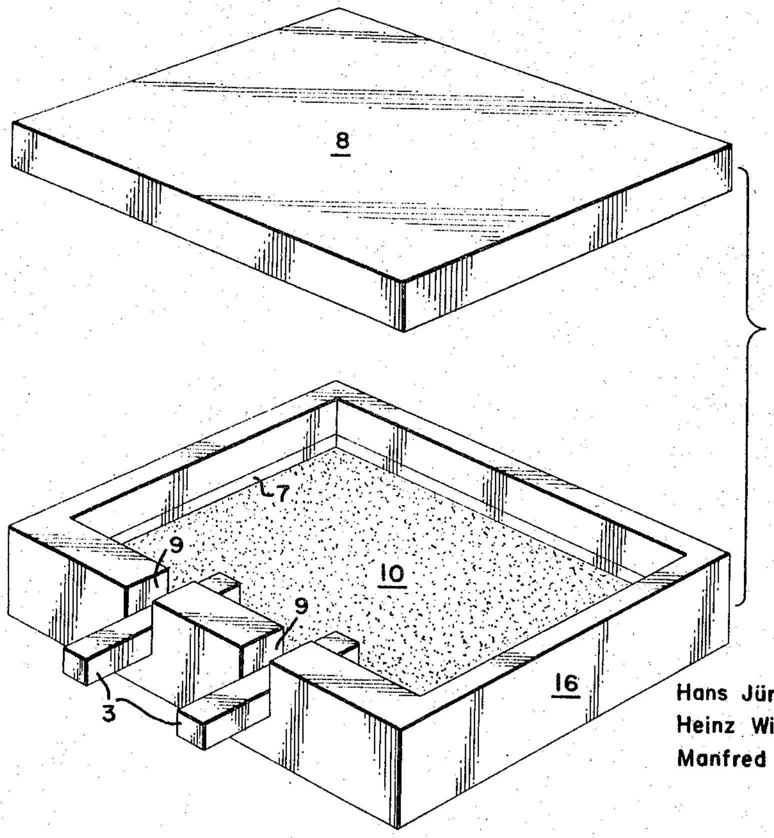

FIGURE 4 is an exploded view of an arrangement for fabricating one embodiment of the present invention.

In an arrangement of the character described and shown, it is particularly advantageous if the metal pins which are used are of the same thickness as the insulating body, and this may be, for example, one millimeter. The metal pin may be connected with the insulating body in a known manner by first metallizing the body and then soldering them together. Alternatively, the metal pin may be embedded into the insulating body in a single working step together with the pressing and sintering operation. In both cases, after the embedding and soldering processes, there is subsequently an abrading and polishing operation of the entire insulating plate which is provided with the pin or pins. After this, in a manner which is known per se, the circuit which comprises the passive or active elements may be evaporated or sputtered onto this plate or body.

In some instances it is advantageous to insert the active elements separately into the micromodule body. For example, this may be done by soldering an encapsulated element into the body. In such an event it is well to provide the plate with a recess or even with a bore or hole, for an advantageous arrangement is thus provided. Metal pins are inserted into the perimeter of this recess or hole and end flush with the surface of the insulating body. The contacts or terminals of the active element are directly welded or soldered onto these metal parts.

Thus, one feature of the present invention provides for embedding metal pins in the insulating body and particularly stable metal contacts are formed since a smooth transition from the metal to the insulating body is assured. This smooth transition, which results in a flush surface between the metal pins and the insulating body, permits circuit elements in the form of thin films, or layers, to be deposited on the insulating body and to contact selected ones of the metal pins. If a flush surface did not exist between the pins and the body, it would be impossible to produce a dependable electrical contact between such elements and the metal pins during the deposition operation. Furthermore, the use of rectangular outer contact pins has the advantage in that when connecting various micromodule plates with one another, the known Wire Wrap Method may be used. In such a method, the connection wire is wrapped about the pin under strong tension and because of this a type of diffusion soldering or diffusion welding occurs at the sharp edges or corners.

As shown in FIGURE 1, an insulating plate 1 is provided which may be constructed of ceramic or glass, for example. Two rectangular slots 2 are provided in a narrow end face or edge of the plate, and metal pins 3 having rectangular cross sections are embedded into the slots. These metal pins 3 are of the same thickness as the insulating plate 1 and they may be fastened by soldering them to the insulating body 1. The body is to be metallized before this soldering step.

On the other hand, the pins may be embedded in a single working step together with the pressing and sintering operation which is performed on the insulating body 1. Subsequently, the entire insulating plate 1, together with the metal pins 3, is abraded and polished and thus the metal plate and the pins are connected with one another in a flush and smooth arrangement. After the carrier plate has been produced, the desired micromodule systems may be evaporated or sputtered onto the surface of this plate.

It should be noted that the illustration of FIGURE 1 may be considered to indicate the external edge of a plate or it may indicate the edge or perimeter of a recess or hole within an insulating plate. In such an arrangement the same method of production may be used as has been described above.

The following specific examples of producing an embodiment of the present invention are set forth for purposes of explanation only and are not to be construed in a limiting sense.

In an insulating plate consisting of a ceramic of the type known as Pyroceram, having a size of two by two centimeters and a thickness of about one millimeter, is formed a recess. In one narrow edge, and in the peripheral edge of the recess, of the plate are sawed several rectangular slots. After this a metal paste, for example molybdenum-manganese, is applied in these slots and then burned in at a temperature of approximately 1150° C. After this the ceramic plate is inserted in a soldering fixture made of carbon, the pins are put in the provided slots together with a solder, for instance consisting of silver and copper. In a furnace this arrangement is heated up to the eutectic temperature of the solder alloy. In the case of a silver-copper solder, this temperature is approximately 780° C. Subsequently the entire insulating plate together with the soldered metal pins is abraded and polished to such an extent that the maximum roughness of the entire composite surface does not exceed 0.1 micromillimeters.

An embodiment of the invention, as it has been described above, is shown in FIGURE 2. Along one edge, and in the peripheral edge of the recess 4, of the carrier plate 1 are formed eight rectangular slots 2, in which metal pins 3, are embedded.

FIGURES 3*a* and 3*b* are partial cross-sectional views showing two of the metal pins 3 of the arrangement of FIGURE 2. As may be seen from FIGURE 3*a*, the slot in which each pin is inserted is provided with a metallic coating 5 for facilitating the soldering of the pins 3 to the insulating body 1. The pins are soldered into the slots by a layer of solder 6 which extends around the entire slot, as may be best seen in FIGURE 3*b*.

There is also the possibility to produce the carrier plate in a single working step, utilizing a mold of the type shown in FIGURE 4. For this a mass 10 of glass-powder and the metal pins 3 are put into a mold 16 made of carbon, or graphites which has a form corresponding to the outlines of the carrier plate, this form being defined by a rectangular ledge 7 whose horizontal surface is arranged for carrying a mold cover 8. Mold 16 is provided with a plurality of slots 9 for the insertion and the positioning of the pins 3. The pins 3 are positioned in the slots 9 and a suitable quantity of glass-powder 10 is poured into the mold. The cover is then put onto the mold. The glass-powder is sintered at a temperature of approximately 1000° C. and pressed by the application of pressure on the cover 8. After cooling down the carrier plate is also abraded and polished as it has been described above.

It will be understood that the above description of the present invention is susceptible to various modifications, changes, and adaptations, and the same are intended to be comprehended within the meaning and range of equivalents of the appended claims.

What is claimed is:

1. A method of making a circuit element comprising the steps of:

(a) providing an insulating plate having two opposed surfaces, at least one of which is planar, and at least one outer edge defining the lateral extent of said surfaces;

(b) forming an opening through said plate to define an inner edge;

(c) forming slots in said inner edge and said outer edge of said plate, with said slots extending to said surfaces;

(d) metallizing the slots of the plate;

(e) inserting a respective complementarily shaped metal pin of about the same thickness as the plate into each slot, each said pin being of a length to project laterally beyond its associated plate edge;

(f) securing each such metal pin in its respective metallized slot;

(g) abrading and then polishing each such metal pin and said planar plate surface to provide a continuous planar surface defined by one surface of each said pin and said planar plate surface;

(h) providing a circuit element having leads in said opening and electrically connecting the leads thereof with the pins projecting into the opening;

(i) depositing passive conductive elements upon the abraded and polished surfaces to electrically connect at least certain of the pins.

2. The method as defined in claim 1 wherein each metal pin is connected with the plate by soldering.

3. A method of making a circuit element comprising the steps of:

(a) providing an insulating plate having two opposed surfaces, at least one of which is planar, and at least one edge defining the lateral extent of said surfaces;

(b) forming slots along the edge of the plate with said slots extending to said surfaces;

(c) metallizing the slots of the plates;

(d) inserting a respective complementarily shaped metal pin of about the same thickness as the plate into each slot, each said pin being of a length to project laterally beyond its associated plate edge;

(e) securing each such metal pin in its respective metallized slot;

(f) abrading and then polishing each such metal pin and the planar plate surface to provide a continuous planar surface defined by one surface of each pin and said planar plate surface; and (g) depositing passive conductive elements upon the abraded and polished surfaces to electrically connect at least certain of the pins.

References Cited by the Examiner

UNITED STATES PATENTS

| | | | |
|---|---|---|---|
| 133,259 | 11/1872 | Rowley | 264—139 |
| 2,347,421 | 4/1944 | Little | 65—18 |
| 2,495,734 | 1/1950 | Katzman et al. | 339—217 |
| 2,561,520 | 7/1951 | Lemmens et al. | 65—59 |
| 2,641,341 | 6/1953 | Touvay | 52—208 |
| 2,744,180 | 5/1956 | Sullivan | 200—166 |
| 2,752,537 | 6/1956 | Wolfe | 317—101 |
| 2,774,014 | 12/1956 | Henry | 317—101 |
| 2,883,635 | 4/1959 | Clark | 339—192 |
| 2,908,072 | 10/1959 | Johnson | 29—473.1 |
| 2,952,789 | 9/1960 | McCullough et al. | 339—190 X |
| 2,971,138 | 2/1961 | Meisel et al. | 317—234 |
| 2,989,669 | 6/1961 | Lathrop | 317—234 |
| 3,029,495 | 4/1962 | Doctor | 29—155.5 |
| 3,040,213 | 6/1962 | Byer et al. | 174—68.5 X |
| 3,047,749 | 7/1962 | Fisher | 310—9.4 |
| 3,088,085 | 4/1963 | Solow | 339—217 |
| 3,103,067 | 9/1963 | Dixon | 29—473.1 |
| 3,176,191 | 3/1965 | Rowe | 29—155.5 |
| 3,220,095 | 11/1965 | Smith | 29—155.5 |

JOHN F. CAMPBELL, *Primary Examiner.*

JOSEPH D. SEERS, WHITMORE A. WILTZ, *Examiners.*

P. A. CLIFFORD, R. W. CHURCH, *Assistant Examiners.*